(12) United States Patent
Rendall et al.

(10) Patent No.: US 12,385,123 B2
(45) Date of Patent: Aug. 12, 2025

(54) SPUTTER DEPOSITION APPARATUS AND METHOD

(71) Applicant: Dyson Technology Limited, Wiltshire (GB)

(72) Inventors: Michael Edward Rendall, Newbury (GB); Robert Ian Joseph Gruar, Swindon (GB)

(73) Assignee: Dyson Technology Limited, Wiltshire (GB)

( * ) Notice: Subject to any disclaimer, the term of this patent is extended or adjusted under 35 U.S.C. 154(b) by 417 days.

(21) Appl. No.: 17/776,709

(22) PCT Filed: Nov. 10, 2020

(86) PCT No.: PCT/GB2020/052848
§ 371 (c)(1),
(2) Date: May 13, 2022

(87) PCT Pub. No.: WO2021/094731
PCT Pub. Date: May 20, 2021

(65) Prior Publication Data
US 2022/0396865 A1    Dec. 15, 2022

(30) Foreign Application Priority Data

Nov. 15, 2019    (GB) .................................... 1916626

(51) Int. Cl.
*C23C 14/34*    (2006.01)
*C23C 14/02*    (2006.01)
(Continued)

(52) U.S. Cl.
CPC ............ *C23C 14/02* (2013.01); *C23C 14/351* (2013.01); *C23C 14/50* (2013.01); *C23C 14/54* (2013.01);
(Continued)

(58) Field of Classification Search
CPC ....... C23C 14/02; C23C 14/351; C23C 14/50; C23C 14/54; C23C 14/022; C23C 14/562;
(Continued)

(56) References Cited

U.S. PATENT DOCUMENTS 3,829,373 A    8/1974    Kuehnle
4,026,787 A    5/1977    Kuehnle
(Continued)

FOREIGN PATENT DOCUMENTS

CN    101457343 A    6/2009
CN    101527362 A    9/2009
(Continued)

OTHER PUBLICATIONS

Office Action received for Japanese Patent Application No. 2022-528191, mailed on Jun. 27, 2023, 14 pages (8 pages of English Translation and 6 pages of Original Document).
(Continued)

*Primary Examiner* — Rodney G McDonald
(74) *Attorney, Agent, or Firm* — Tucker Ellis LLP (57) ABSTRACT

Certain examples described herein relate to a sputter deposition apparatus including a guiding member to guide a substrate in a conveyance direction, a plasma source to generate a plasma, and a magnet arrangement. The magnet arrangement is configured to confine the plasma within the apparatus to a pre-treatment zone, within which the substrate is exposed to the plasma in use. The magnet arrangement is also configured to confine the plasma within the apparatus to a sputter deposition zone, located after the pre-treatment zone in the conveyance direction, to provide for sputter deposition of a target material to the substrate in use. The pre-treatment and sputter deposition zones are disposed about the guiding member.

22 Claims, 5 Drawing Sheets

(51) Int. Cl.
  *C23C 14/35* (2006.01)
  *C23C 14/50* (2006.01)
  *C23C 14/54* (2006.01)
  *H01J 37/32* (2006.01)
  *H01J 37/34* (2006.01)

(52) U.S. Cl.
  CPC .... *H01J 37/32733* (2013.01); *H01J 37/3277* (2013.01); *H01J 37/3405* (2013.01); *H01J 37/3417* (2013.01); *H01J 37/3452* (2013.01)

(58) Field of Classification Search
  CPC ..... C23C 14/0021; C23C 14/34; C23C 14/56; H01J 37/321; H01J 37/3211; H01J 37/32733; H01J 37/3277; H01J 37/3405; H01J 37/3417; H01J 37/3452
  USPC ...................................... 204/298.06, 298.24
  See application file for complete search history.

(56) References Cited

U.S. PATENT DOCUMENTS

| | | | |
|---|---|---|---|
| 4,278,528 A | 7/1981 | Kuehnle et al. | |
| 4,492,620 A | 1/1985 | Matsuo et al. | |
| 4,849,087 A | 7/1989 | Meyer | |
| 4,885,070 A * | 12/1989 | Campbell | C23C 14/46 |
| | | | 204/298.18 |
| 4,990,229 A | 2/1991 | Campbell et al. | |
| 5,091,049 A | 2/1992 | Campbell et al. | |
| 5,122,251 A | 6/1992 | Campbell et al. | |
| 5,215,638 A | 6/1993 | Hausler | |
| 6,103,070 A | 8/2000 | Hong | |
| 6,632,563 B1 | 10/2003 | Krasnov et al. | |
| 8,916,034 B2 * | 12/2014 | Setsuhara | H01J 37/3417 |
| | | | 204/298.19 |
| 2001/0033952 A1 | 10/2001 | Jenson et al. | |
| 2002/0144656 A1 | 10/2002 | Yoshikawa et al. | |
| 2002/0175069 A1 | 11/2002 | Domoto et al. | |
| 2004/0048157 A1 | 3/2004 | Neudecker et al. | |
| 2004/0089535 A1 | 5/2004 | Wolfe et al. | |
| 2004/0118678 A1 | 6/2004 | Hartig | |
| 2006/0134522 A1 | 6/2006 | Zhang et al. | |
| 2006/0196766 A1 | 9/2006 | Chen | |
| 2007/0125638 A1 | 6/2007 | Zhang et al. | |
| 2007/0166612 A1 | 7/2007 | Krasnov et al. | |
| 2007/0181421 A1 | 8/2007 | Wei et al. | |
| 2008/0023146 A1 | 1/2008 | Shabalin | |
| 2008/0035471 A1 | 2/2008 | Mikami et al. | |
| 2009/0032191 A1 | 2/2009 | Chistyakov | |
| 2009/0057136 A1 | 3/2009 | Wang et al. | |
| 2009/0159429 A1 | 6/2009 | Tsukamoto | |
| 2009/0159433 A1 | 6/2009 | Neudecker et al. | |
| 2009/0159441 A1 | 6/2009 | Marunaka et al. | |
| 2009/0277778 A1 | 11/2009 | Stowell et al. | |
| 2009/0288943 A1 | 11/2009 | Kwak et al. | |
| 2011/0117433 A1 | 5/2011 | Sabi et al. | |
| 2011/0226617 A1 | 9/2011 | Hofmann et al. | |
| 2011/0266141 A1 | 11/2011 | Drayton et al. | |
| 2012/0275008 A1 | 11/2012 | Pradhan et al. | |
| 2013/0112546 A1 | 5/2013 | Brown et al. | |
| 2014/0183036 A1 | 7/2014 | Shao et al. | |
| 2015/0016265 A1 | 1/2015 | Ahmadi | |
| 2016/0233541 A1 | 8/2016 | Anapolsky et al. | |
| 2017/0207071 A1 | 7/2017 | De Bosscher et al. | |
| 2018/0245217 A1 | 8/2018 | Guo | |
| 2019/0153589 A1 | 5/2019 | Puls et al. | |
| 2020/0095672 A1 | 3/2020 | Honma et al. | |
| 2021/0371297 A1 | 12/2021 | Perkins et al. | |
| 2022/0277940 A1 | 9/2022 | Rendall | |
| 2022/0380885 A1 | 12/2022 | Rendall et al. | |
| 2022/0380903 A1 | 12/2022 | Rendall et al. | |
| 2022/0384159 A1 | 12/2022 | Rendall et al. | |
| 2022/0389586 A1 | 12/2022 | Rendall et al. | |
| 2022/0393142 A1 | 12/2022 | Gruar | |
| 2022/0396869 A1 | 12/2022 | Rendall | |
| 2022/0403499 A1 | 12/2022 | Rendall et al. | |
| 2022/0407043 A1 | 12/2022 | Rendall et al. | |
| 2022/0411913 A1 | 12/2022 | Gruar | |
| 2023/0220539 A1 | 7/2023 | Rendall et al. | |

FOREIGN PATENT DOCUMENTS

| | | |
|---|---|---|
| CN | 101796213 A | 8/2010 |
| CN | 101903560 A | 12/2010 |
| CN | 101970709 A | 2/2011 |
| CN | 102037586 A | 4/2011 |
| CN | 105593395 A | 5/2016 |
| CN | 105874641 A | 8/2016 |
| CN | 105951053 A | 9/2016 |
| CN | 205803586 U | 12/2016 |
| CN | 106684325 A | 5/2017 |
| CN | 108281618 A | 7/2018 |
| CN | 109075006 A | 12/2018 |
| CN | 109402562 A | 3/2019 |
| CN | 109415802 A | 3/2019 |
| CN | 109415804 A | 3/2019 |
| CN | 109477203 A | 3/2019 |
| CN | 109844900 A | 6/2019 |
| CN | 110168130 A | 8/2019 |
| CN | 110349838 A | 10/2019 |
| DE | 4126236 A1 | 2/1993 |
| DE | 4418906 A1 | 12/1995 |
| EP | 0103461 A2 | 3/1984 |
| EP | 0403418 A2 | 12/1990 |
| EP | 0837490 A2 | 4/1998 |
| EP | 1729330 A1 | 12/2006 |
| EP | 2527487 A1 | 11/2012 |
| EP | 3396751 A1 | 10/2018 |
| EP | 3399539 A1 | 11/2018 |
| GB | 1462241 A | 1/1977 |
| GB | 0007173 | 5/2000 |
| GB | 2360530 A | 9/2001 |
| GB | 2572610 A | 10/2019 |
| JP | 49-101273 A | 9/1974 |
| JP | 61-009575 A | 1/1986 |
| JP | 61-093542 A | 5/1986 |
| JP | 03-068773 A | 3/1991 |
| JP | H05-171433 A | 7/1993 |
| JP | 10-150210 A | 6/1998 |
| JP | H10-510676 A | 10/1998 |
| JP | 11-269643 A | 10/1999 |
| JP | 2002-235171 A | 8/2002 |
| JP | 2003-007291 A | 1/2003 |
| JP | 2004-043934 A | 2/2004 |
| JP | 2006-257546 A | 9/2006 |
| JP | 2006322055 A | 11/2006 |
| JP | 2007-005219 A | 1/2007 |
| JP | 2007-067183 A | 3/2007 |
| JP | 2008-045213 A | 2/2008 |
| JP | 2008-138229 A | 6/2008 |
| JP | 2011-032550 A | 2/2011 |
| JP | 2011-108532 A | 6/2011 |
| JP | 2011-521433 A | 7/2011 |
| JP | 2011-225932 A | 11/2011 |
| JP | 2013-028824 A | 2/2013 |
| JP | 2013-164971 A | 8/2013 |
| JP | 2015193863 A | 11/2015 |
| JP | 2015232158 A | 12/2015 |
| JP | 2017066429 A | 4/2017 |
| JP | 2017-186581 A | 10/2017 |
| JP | 6215329 B2 | 10/2017 |
| JP | 2019-104956 A | 6/2019 |
| KR | 10-2006-0124978 A | 12/2006 |
| KR | 100762698 B1 | 10/2007 |
| KR | 10-2008-0000736 A | 1/2008 |
| KR | 10-2011-0092965 A | 8/2011 |
| KR | 10-2015-0005262 A | 1/2015 |
| KR | 20180049257 A | 5/2018 |
| KR | 101990881 B1 | 6/2019 |
| KR | 20190065233 A | 6/2019 |
| WO | 89/07664 A1 | 8/1989 |
| WO | 02/21627 A2 | 3/2002 |
| WO | 2004/017356 A2 | 2/2004 |
| WO | 2009/143254 A2 | 11/2009 |

(56) References Cited

FOREIGN PATENT DOCUMENTS

| WO | 2010/023878 | A1 | 3/2010 |
|---|---|---|---|
| WO | 2010/144761 | A2 | 12/2010 |
| WO | 2011/131921 | A1 | 10/2011 |
| WO | 2014/156129 | A1 | 10/2014 |
| WO | 2016/078693 | A1 | 5/2016 |
| WO | 2018/001523 | A1 | 1/2018 |
| WO | 2018/128009 | A1 | 7/2018 |
| WO | 2018/202656 | A1 | 11/2018 |
| WO | 2018/225822 | A1 | 12/2018 |
| WO | 2019/181095 | A1 | 9/2019 |
| WO | 2021/094721 | A1 | 5/2021 |
| WO | 2021/094772 | A1 | 5/2021 |

OTHER PUBLICATIONS

Office Action received for Japanese Patent Application No. 2022-528195, mailed on Jun. 27, 2023, 11 pages (6 pages of English Translation and 5 pages of Original Document).
Office Action received for Japanese Patent Application No. 2022-528195, mailed on Oct. 17, 2023, 10 pages (6 pages of English Translation and 4 pages of Original Document).
International Search Report and Written Opinion received for PCT Patent Application No. PCT/GB2020/052838, mailed on Feb. 18, 2021, 9 pages.
International Search Report and Written Opinion received for PCT Patent Application No. PCT/GB2020/052893, mailed on Feb. 22, 2021, 11 pages.
International Search Report and Written Opinion received for PCT Patent Application No. PCT/GB2020/052896, mailed on Feb. 22, 2021, 10 pages.
Ribeiro, J. F., et al. "Lithium cobalt oxide crystallization on flexible polyimide substrate." Journal of Materials Science: Materials in Electronics 27 (2016): 631-636.
Office Action received for Japanese Patent Application No. 2022-528153, mailed on Jul. 25, 2023, 7 pages (3 pages of English Translation and 4 pages of Original Document).
Office Action received for Japanese Patent Application No. 2022-528167, mailed on Aug. 29, 2023, 2 pages of Original Document Only.
Kikuchi et al., "Modification of Film Structure in Sputtering Process," Journal of the Vacuum Society of Japan, vol. 50, No. 1, 2007, pp. 14-21.
Office Action received for Japanese Patent Application No. 2022-528173, mailed on Aug. 1, 2023, 4 pages (2 pages of English Translation and 2 pages of Original Document).
Office Action received for Japanese Patent Application No. 2022-528178, mailed on Aug. 8, 2023, 6 pages (3 pages of English Translation and 3 pages of Original Document).
Office Action received for Japanese Patent Application No. 2022-528188, mailed on Aug. 8, 2023, 6 pages (3 pages of English Translation and 3 pages of Original Document).
Office Action received for Japanese Patent Application No. 2022-528189, mailed on Aug. 8, 2023, 6 pages (3 pages of English Translation and 3 pages of Original Document).
Akazawa, "Highly adhesive Pt-electrode films directly deposited on SiO2 by electron-cyclotron-resonance plasma sputtering", Surface & Coatings Technology, vol. 204, 2010, pp. 1836-1841.
Combined Search and Examination Report Received for GB Application No. 1916628.9, mailed on May 5, 2020, 6 pages.
Combined Search and Examination Report Received for GB Application No. 1916632.1, mailed on May 5, 2020, 3 pages.
Combined Search and Examination Report Received for GB Application No. 1916633.9, mailed on May 4, 2020, 3 pages.
Combined Search and Examination Report Received for GB Application No. 1916634.7, mailed on May 15, 2020, 3 pages.
Combined Search and Examination Report Received for GB Application No. 1916635.4, mailed on May 5, 2020, 4 pages.
GB Search Report received for Application No. 1916619.8, mailed on May 7, 2020, 1 page.
GB Search Report received for Application No. 1916622.2, mailed on Mar. 30, 2020, 1 page.
GB Search Report received for Application No. 1916624.8, mailed on Apr. 29, 2020, 1 Page.
GB Search Report Received for GB Application No. 1916626.3, mailed on May 12, 2020, 1 page.
GB Search Report Received for GB Application No. 1916629.7, mailed on May 15, 2020, 1 page.
GB Search Report received for Patent Application No. 1916627.1, mailed on May 12, 2020, 1 page.
GB Search Report received for Patent Application No. 1916637.0, mailed on Mar. 30, 2020, 1 Page.
Hayashi et al., "Preparation of positive LiCoO2 films by electron cyclotron resonance (ECR) plasma sputtering method and its application to all-solid-state thin-film lithium batteries", Journal of Power Sources vol. 174, 2007, pp. 990-995.
International Search Report and Written Opinion received for PCT Patent Application No. PCT/GB20/052837, mailed on Feb. 12, 2021, 11 pages.
International Search Report and Written Opinion received for PCT Patent Application No. PCT/GB2020/052839, mailed on Feb. 23, 2021, 11 pages.
International Search Report and Written Opinion received for PCT Patent Application No. PCT/GB2020/052840, mailed on Feb. 25, 2021, 11 pages.
International Search Report and Written Opinion received for PCT Patent Application No. PCT/GB2020/052841, mailed on Mar. 1, 2021, 13 pages.
International Search Report and Written Opinion received for PCT Patent Application No. PCT/GB2020/052842, mailed on Feb. 25, 2021, 11 pages.
International Search Report and Written Opinion received for PCT Patent Application No. PCT/GB2020/052843, mailed on Feb. 26, 2021, 13 pages.
International Search Report and Written Opinion received for PCT Patent Application No. PCT/GB2020/052844, mailed on Feb. 18, 2021, 12 pages.
International Search Report and Written Opinion received for PCT Patent Application No. PCT/GB2020/052848, mailed on Dec. 23, 2020, 10 pages.
International Search Report and Written Opinion received for PCT Patent Application No. PCT/GB2020/052892, mailed on Feb. 25, 2021, 12 pages.
International Search Report and Written Opinion received for PCT Patent Application No. PCT/GB2020/052894, mailed on Mar. 9, 2021, 13 pages.
International Search Report and Written Opinion received for PCT Patent Application No. PCT/GB2020/052895, mailed on Mar. 5, 2021, 12 pages.
International Search Report and Written Opinion received for PCT Patent Application No. PCT/GB2020/052897, mailed on Mar. 3, 2021, 12 pages.
Julien E. et al., "Sputtered LiCoO2 Cathode Materials for All-solid-state Thin-film Lithium Microbatteries," Materials, vol. 12, No. 17, 2019, 2687, pp. 26.
Knox-Davies et al., "Properties of nanocrystalline GaN films deposited by reactive sputtering," Diamond and Related Materials, Elsevier Science Publishers, vol. 12, No. 8, 2003, pp. 1417-1421.

\* cited by examiner

SPUTTER DEPOSITION APPARATUS AND METHOD

CROSS-REFERENCE TO PRIOR APPLICATION

This application is a § 371 National Stage Application of PCT International Application No. PCT/GB2020/052848 filed Nov. 10, 2020, which claims the priority of United Kingdom Application No. 1916626.3, filed Nov. 15, 2019, each of which are herein incorporated by reference in their entirety.

TECHNICAL FIELD

The present invention relates to deposition, and more particularly to methods and apparatuses for sputter deposition.

BACKGROUND

Deposition is a process by which target material is deposited on a substrate. An example of deposition is thin film deposition in which a thin layer (typically from around a nanometre or even a fraction of a nanometre up to several micrometres or even tens of micrometres) is deposited on a substrate, such as a silicon wafer or web. An example technique for thin film deposition is Physical Vapor Deposition (PVD), in which target material in a condensed phase is vaporised to produce a vapor, which vapor is then condensed onto the substrate surface. An example of PVD is sputter deposition, in which particles are ejected from the target as a result of bombardment by energetic particles, such as ions. In examples of sputter deposition, a sputter gas, such as an inert gas, such as Argon, is introduced into a vacuum chamber at low pressure, and the sputter gas is ionised using energetic electrons to create a plasma. Bombardment of the target by ions of the plasma eject target material which may then deposit on the substrate surface. Sputter deposition has advantages over other thin film deposition methods such as evaporation in that target materials may be deposited without the need to heat the target material, which may in turn reduce or prevent thermal damage to the substrate.

SUMMARY

According to a first aspect of the present invention, there is provided a sputter deposition apparatus comprising:
  a guiding member to guide a substrate in a conveyance direction;
  a plasma source to generate a plasma;
  a magnet arrangement configured to confine the plasma within the apparatus to:
    a pre-treatment zone, within which the substrate is exposed to the plasma in use; and
    a sputter deposition zone, located after the pre-treatment zone in the conveyance direction, to provide for sputter deposition of a target material to the substrate in use;
    wherein the pre-treatment and sputter deposition zones are disposed about the guiding member.

Confining the generated plasma in this way, with the pre-treatment and sputter deposition zones disposed about the guiding member, may allow for more efficient use of generated plasma. In turn, a more energy-efficient sputter deposition process can be attained compared to known apparatuses and processes. The present apparatus may also provide improved space-efficiency compared to known sputter deposition apparatuses. For example, disposing the pre-treatment and sputter deposition zones about the guiding member can reduce the need for further components which can take up more space and add to the overall energy requirements. Additional components can also make the apparatus more complex to run and maintain. Confining the generated plasma in this way may allow for the same plasma source to be used for both pre-treating the substrate and providing for sputter deposition of target material thereto. Furthermore, the same guiding member can be used to provide for the separate pre-treatment and deposition zones, thus saving space and energy requirements compared to e.g. using separate plasma sources and/or substrate guiding members, given the control provided by the magnet arrangement confining the plasma.

In some examples, the magnet arrangement is configured to confine the plasma within the pre-treatment zone to interact with at least part of a surface of the substrate in use. This interaction can provide for treatment of the surface of the substrate prior to the substrate entering the sputter deposition zone, which can improve the deposition of target material onto the substrate during deposition.

In some examples, within the pre-treatment zone the plasma interacts with the substrate in an ablative process in use. Ablation of the substrate allows for increased homogeneity and/or roughness of the substrate surface prior to deposition which can improve uniformity and/or control of crystallinity of deposition of target material onto the substrate during the sputter deposition process.

In some examples, the magnet arrangement is configured to confine the plasma to extend between the pre-treatment and sputter deposition zones about the guiding member.

In some examples, the sputter deposition apparatus comprises a target portion arranged to support the target material, wherein the deposition zone is located between the target portion and the guiding member.

In some examples, the magnet arrangement is configured to confine the plasma in the form of a sheet. This can allow for a substantially uniform density of the plasma in the pre-treatment zone and/or the deposition zone, which can improve uniformity of the deposition of target material onto the substrate.

In some examples, the guiding member comprises a curved member. In some examples, the curved member comprises a roller. This may allow the sputter deposition apparatus to be implemented with a roll-to-roll system for conveying the substrate. The roll-to-roll system may also enable an easier manufacturing pathway to a continuous double-sided deposition process.

In some examples, the plasma substantially conforms to a curvature of at least part of a curved surface of the curved member. This can provide for an increased area of the substrate that is exposed to the plasma in the pre-treatment zone and/or the deposition zone.

In some examples, the magnet arrangement is configured to confine the plasma around the curved member and into the pre-treatment zone.

In some examples, the magnet arrangement comprises one or more magnetic elements.

In some examples, the magnet arrangement comprises at least two magnetic elements arranged such that a region of relatively high magnetic field strength, defined between the at least two magnetic elements, is in the form of a sheet.

In some examples, one or more of the magnetic elements is an electromagnet.

In some examples, sputter deposition apparatus comprises a magnetic controller to control a magnetic field strength of one or more of the one or more magnetic elements. This may allow for adjustment of the plasma density at the substrate and/or the target material within the deposition zone, and hence allow for improved control over the sputter deposition. This may in turn allow for improved flexibility in the operation of the sputter deposition apparatus. Furthermore, the ability to control the magnetic field strength can similarly allow for adjustment of the plasma density at the substrate within the pre-treatment zone. This may in turn allow for improved control of the pre-treatment process and add to the flexibility in the operation of the sputter deposition apparatus, meaning that different types of substrate and/or target material may be utilised.

In some examples, one or more of the magnetic elements comprises a solenoid, the solenoid being elongate in cross-section. In some examples, in which the guiding member comprises a curved member, the solenoid may be elongate, in cross section, in a direction substantially parallel to an axis of rotation of the curved member.

In some examples, in which the guiding member comprises a curved member, the magnet arrangement is disposed outside a curve of the curved member.

In some examples, the plasma source is an inductively coupled plasma source.

In some examples, the plasma source comprises one or more elongate antennae. In some examples, one or more of the elongate antennae are substantially linear. In some examples, one or more of the elongate antennae extend in a direction substantially perpendicular to the conveyance direction. In some examples, one or more of the elongate antennae are curved. In some examples, in which the guiding member comprises a curved member, one or more of the curved elongate antennae extend in a plane substantially perpendicular to the longitudinal axis of the curved member. In some examples, in which the guiding member comprises a curved member, one or more of the elongate antennae may extend in a direction substantially parallel to a longitudinal axis of the curved member.

According to a second aspect of the present invention, there is provided a sputter deposition method comprising:
   guiding a substrate, using a guiding member, in a conveyance direction;
   generating plasma using a plasma source;
   confining said plasma, using a magnet arrangement, to:
      a pre-treatment zone, within which the substrate is exposed to the plasma; and
      a sputter deposition zone, located after the pre-treatment zone in the conveyance direction, to provide for sputter deposition of a target material to the substrate;
   wherein the pre-treatment and sputter deposition zones are disposed about the guiding member.

Further features and advantages of the invention will become apparent from the following description, given by way of example only, which is made with reference to the accompanying drawings.

DETAILED DESCRIPTION

Details of apparatuses and methods according to examples will become apparent from the following description, with reference to the Figures. In this description, for the purpose of explanation, numerous specific details of certain examples are set forth. Reference in the specification to "an example" or similar language means that a particular feature, structure, or characteristic described in connection with the example is included in at least that one example, but not necessarily in other examples. It should further be noted that certain examples are described schematically with certain features omitted and/or necessarily simplified for ease of explanation and understanding of the concepts underlying the examples.

Referring to FIGS. 1 to 5, an example sputter deposition apparatus 100 is illustrated. The apparatus 100 may be used for sputter deposition of target material 108 to a substrate 116, and can thus be implemented in a wide number of industrial applications, such as those which have utility for the deposition of thin films, for example (e.g.) in the production of optical coatings, magnetic recording media, electronic semiconductor devices, LEDs, energy generation devices such as thin-film solar cells, and energy storage devices such as thin-film batteries. Therefore, while the context of the present disclosure may in some cases relate to the production of energy storage devices or portions thereof, it will be appreciated that the sputter deposition apparatus 100 and sputter deposition methods described herein are not limited to the production thereof.

Although not shown in the Figures for clarity, it is to be appreciated that the apparatus 100 may be provided within a housing (not shown), which in use may be evacuated to a low pressure suitable for sputter deposition, for example $3 \times 10^{-3}$ torr. For example, the housing (not shown) may be evacuated by a pumping system (not shown) to a suitable pressure (for example less than $1 \times 10^{-5}$ torr), and in use a process or sputter gas, such as argon or nitrogen, may be introduced into the housing (not shown) using a gas feed system (not shown) to an extent such that a pressure suitable for sputter deposition is achieved (for example $3 \times 10^{-3}$ torr).

Returning to the example illustrated in FIGS. 1 to 5, in broad overview, the apparatus 100 comprises a guiding member 118, a plasma source 102, and a magnet arrangement 104.

The guiding member 118 is arranged to guide a substrate 116, e.g. a web of substrate, in a conveyance direction 115. The guiding member 118 may comprise a curved member 118 to guide the substrate 116 along a curved path (indicated by arrow C in FIGS. 1 and 2) for example.

The curved member 118 may be arranged to rotate about an axis 120, for example provided by an axle 120. As per the example illustrated in FIG. 3, the axis 120 may be also a longitudinal axis of the curved member 118. In some examples, the curved member 118 may comprise a roller. In certain cases, the curved member 118 may be provided by a substantially cylindrical drum or roller 118 of an overall substrate feed assembly 119. The substrate feed assembly 119 may be arranged to feed the substrate 116 onto and from the roller 118 such that the substrate 116 is carried by at least part of a curved surface of the roller 118. In some examples, the substrate feed assembly comprises a first roller 110a arranged to feed the substrate 116 onto the drum 118, and a second roller 110b arranged to feed the substrate 116 from the drum 118, after the substrate 116 has followed the curved path C. The substrate feed assembly 119 may be part of a "reel-to-reel" process arrangement (not shown), where the substrate 116 is fed from a first reel or bobbin (not shown) of substrate 116, passes through the apparatus 100, and is then fed onto a second reel or bobbin (not shown) to form a loaded reel of processed substrate (not shown).

In some examples, the substrate 116 may be or comprise silicon or a polymer. In some examples, e.g. for the production of an energy storage device, the substrate 116 may be or comprise nickel foil, but it will be appreciated that any suitable metal could be used instead of nickel, such as aluminium, copper or steel, or a metallised material including metallised plastics such as aluminium on polyethylene terephthalate (PET).

The plasma source 120, which may also be referred to as a "plasma generation arrangement" is arranged to generate plasma 112.

The plasma source 120 may be an inductively coupled plasma source, e.g. arranged to generate an inductively coupled plasma 112. The plasma source 120 may include one or more antennae 102a, 102b, e.g. through which appropriate radio frequency (RF) power may be driven by a radio frequency power supply system (not shown) to generate an inductively coupled plasma 112 from the process- or sputter gas in the housing (not shown). In some examples, plasma 112 may be generated by driving a radio frequency current through the one or more antennae 102a, 102b, for example at a frequency between 1 MHz and 1 GHz; a frequency between 1 MHz and 100 MHz; a frequency between 10 MHz and 40 MHz; or at a frequency of approximately 13.56 MHz or multiples thereof. The RF power causes ionisation of the process- or sputter gas to produce plasma 112. Tuning the RF power driven through the one or more antennae 102a, 102b can affect the plasma density of the plasma 112 within the pre-treatment zone. Thus, by controlling the RF power at the plasma source 102, the pre-treatment process can be controlled. This may in turn allow for improved flexibility in the operation of the sputter deposition apparatus 100.

In some examples, the plasma source 102 may be disposed remotely of the guiding member 118. For example, the plasma source 102 may be disposed at a distance radially away from the curved member 118. As such, plasma 112 may be generated remotely of the guiding member 118.

Figure 1:
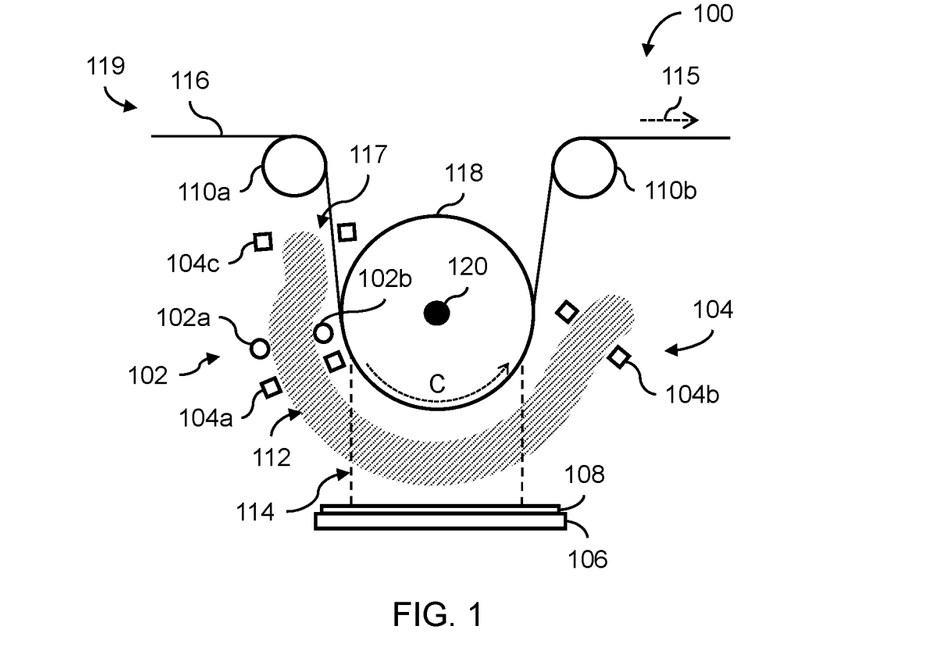
FIG. 1 is a schematic diagram of a cross section of an apparatus according to an example.

The one or more antennae 102a, 102b may be elongate antennae, and in some examples are substantially linear. In some examples, the one or more antennae 102a, 102b may be elongate antennae and extend in a direction substantially parallel to the longitudinal axis 120 of the curved member 118 (e.g. the axis 120 of the roller 118 which passes through the origin of the radius of curvature of the roller 118). In the example of FIG. 1, the longitudinal axis 120 of the roller 118 is also the rotation axis of the roller 118. One or more of the elongate antennae 102a, 102b may be curved. For example, such curved elongate antennae 102a, 102b may follow the curvature of at curved surface of the curved member 118. In some cases, one or more of the curved elongate antennae 102a, 102b extend in a plane substantially perpendicular to the longitudinal axis 120 of the curved member 118.

Figure 3:
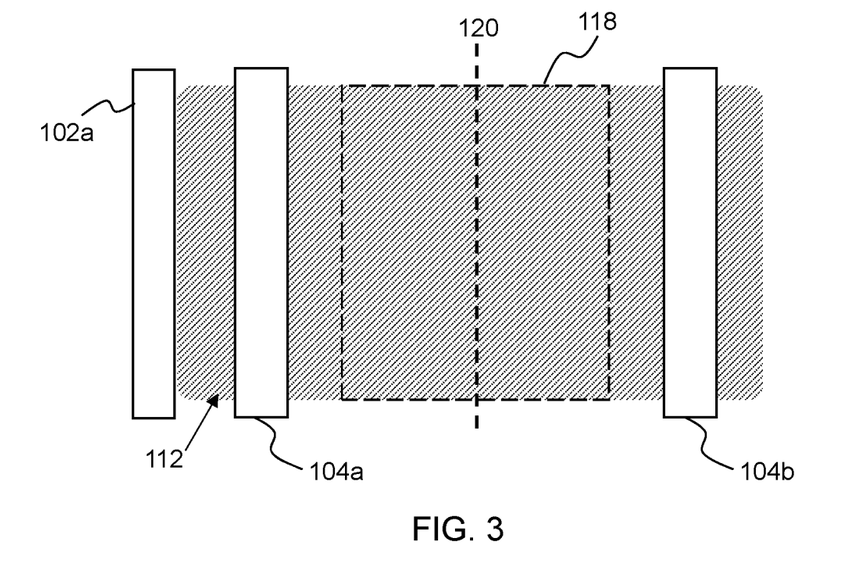
FIG. 3 is a schematic diagram of a plan view of a portion of the example apparatus of FIGS. 1 and 2.

In some examples, the plasma source 102 comprises two antennae 102a, 102b for producing an inductively coupled plasma 112. In some examples (e.g. as illustrated in FIG. 3), the antennae 102a, 102b are elongate and substantially linear and extend parallel to the longitudinal axis 120 (which may also be the rotation axis 120) of the curved member 118. The antennae 102a, 102b may extend substantially parallel to one another and may be disposed laterally from one another. This may allow for a precise generation of an elongate region of plasma 112 between the two antennae 102a, 102b, which may in turn help provide for precise confining of the generated plasma 112 to at least the deposition zone 114, as described in more detail below. In some examples, the antennae 102a, 102b may be similar in length to the guiding member 118, and accordingly similar to the width of the substrate 116 guided by the guiding member 118. The elongate antennae 102a, 102b may provide for plasma 112 to be generated across a region having a length corresponding to the length of the substrate guide 118 (and hence corresponding to the width of the substrate 116), and hence may allow for plasma 112 to be available evenly or uniformly across the width of the substrate 116. As described in more detail below, this may in turn help provide for even or uniform sputter deposition.

The magnet arrangement 104 is configured to confine the plasma 112 (e.g. the plasma generated by the plasma generation arrangement 102) within the apparatus 100 to a sputter deposition zone 114, in order to provide for sputter deposition of target material 108 to the substrate 116 in use.

The magnet arrangement 104 is also configured to confine the plasma 112, within the apparatus 100, to a pre-treatment zone 117, within which the substrate 116 is exposed to the plasma 112 in use. The sputter deposition zone 114 is located after the pre-treatment zone 117, in the conveyance direction 115, and the pre-treatment and sputter deposition zones 114, 117 are disposed about the guiding member 118. This may allow for treatment of the substrate 116 prior to deposition occurring in use, e.g. "pre-treatment" of the substrate 116. Such pre-treatment of the substrate 116 may involve removing material from the surface of the substrate 116 which is to have target material 108 deposited thereon. The sputter deposition process may be improved by the substrate being treated or "activated" by the plasma 112 before deposition. For example, pre-treating the substrate 116 can promote better adhesion of target material 108 to the substrate 116 during the deposition process within the sputter deposition zone 114. The sputter deposition may therefore, in turn, be performed more consistently. This may, for example, improve the consistency of the processed substrate, and may for example, reduce the need for quality control. Having the pre-treatment and sputter deposition zones 114, 117 disposed about the guiding member, e.g. curved member, 118, e.g. as part of a reel-to-reel type apparatus, can allow for more efficient use of generated plasma 112 and thus a more efficient sputter deposition process, but also in a space efficient way. For example, disposing the pre-treatment and sputter deposition zones 114, 117 about the guiding member 118 can reduce the need for further components which can take up more space, add to the energy requirements, and increase the complexity of the apparatus. For example, the same plasma source 102 can be used to both pre-treat the substrate 116 and provide for sputter deposition of target material 108 thereto, and the same guiding member 118 can be used to provide for the separate pre-treatment and deposition zones 114, 117, due to the control provided by the magnet arrangement to confine the plasma 112.

For example, the magnet arrangement 104 may confine the plasma 112 within the pre-treatment zone 117 to interact with at least part of a surface of the substrate 116 in use. Interaction between the plasma 112 and the surface of the substrate 116 can treat the substrate 116 prior to the substrate entering the sputter deposition zone 114. This can improve the deposition of target material 108 onto the substrate 116. In some cases, for example, the plasma 112 interacts with the substrate 116 in an ablative process within the pre-treatment zone 117 in use. The plasma 112 may ablate the substrate surface as part of the treatment thereof, e.g. to remove material from the surface of the substrate 116 which may include impurities such as oligomers, organic contaminants, and/or other inhomogeneities. The inhomogeneities can originate when manufacturing the substrate, e.g. from a polymer solution casting process, wherein contaminants can migrate to the surface of the substrate 116 and later leave a non-uniform "patchy" coating when exposed to heat during the deposition process. Such pre-treatment of the substrate 116 may therefore increase a homogeneity of the substrate surface. In turn, such treatment may allow for more uniform deposition of target material 108 onto the substrate 116 when the substrate 116 reaches the sputter deposition zone 114. The sputter deposition may therefore, in turn, be performed more consistently. This may, for example, improve the consistency of the processed substrate, and may for example, reduce the need for quality control.

Ablation as a mechanism of substrate activation (or "roughening") may depend on a sputtering threshold of the substrate being exceeded. For example, similar to a sputtering threshold of the target material for sputter deposition, the sputtering threshold of the substrate may be a defined minimum energy threshold corresponding to the substrate material.

The sputtering threshold may be a defined amount of energy at which the energy transfer from a plasma ion to an atom of the substrate material equals the binding energy of a surface atom of the substrate material. In other words, sputtering (or ablation) of the substrate may occur when a plasma ion can transfer more energy into the substrate material than is required for an atom to break free from the substrate material surface. Below the sputtering threshold of the substrate material, however, substrate activation or roughening may occur via restructuring of the substrate material. For example, at plasma energies below the sputtering threshold of the substrate material, the transfer of energy from the plasma ions to the substrate material may cause bond-breaking and reformation, e.g. chemical bonds between atoms of the substrate material to break and reform. This can cause activation or roughening of the substrate surface without ablation.

The magnet arrangement 104 may comprise one or more magnetic elements 104a, 104b, 104c. The magnetic elements 104a, 104b, 104c may be arranged to provide a confining magnetic field to confine, e.g. in some examples guide, plasma into the pre-treatment and sputter deposition zones 114, 117. The magnet arrangement 104, e.g. the magnetic elements 104a, 104b, 104c, may be disposed outside a curve of the curved member 118.

It will be appreciated that magnetic field lines may be used to describe the arrangement or geometry of a magnetic field. An example magnetic field provided by the example magnetic elements 104a, 104b, 104c is illustrated schematically in FIGS. 2 and 4, where magnetic field lines (indicated as is convention by arrowed lines) are used to describe the magnetic field provided in use.

The magnetic field lines being arranged to impinge on the pre-treatment and sputter deposition zones 114, 117 may confine the generated plasma 112 to the pre-treatment and sputter deposition zones 114, 117. This can occur because the generated plasma 112 tends to follow the magnetic field lines. For example, ions of the plasma 112 within the confining magnetic field and with some initial velocity will experience a Lorentz force that causes the ion to follow a periodic motion around the magnetic field line. If the initial motion is not strictly perpendicular to the magnetic field, the ion follows a helical path centred on the magnetic field line. The plasma containing such ions therefore tends to follow the magnetic field lines and hence can be confined to, e.g. guided on, a path defined thereby. Accordingly, since the magnetic field lines are arranged to enter the pre-treatment and sputter deposition zones 114, 117, the plasma 112 will hence be confined to, e.g. guided into, the pre-treatment and sputter deposition zones 114, 117.

Figure 2:
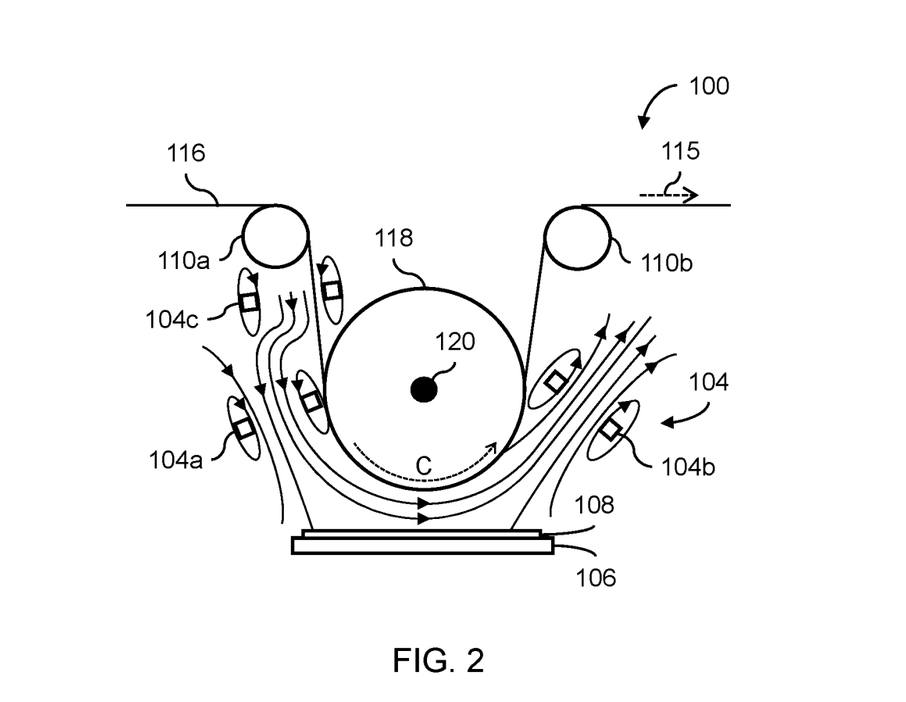
FIG. 2 is a schematic diagram of a cross section of the example apparatus of FIG. 1, but including illustrative magnetic field lines.
Figure 4:
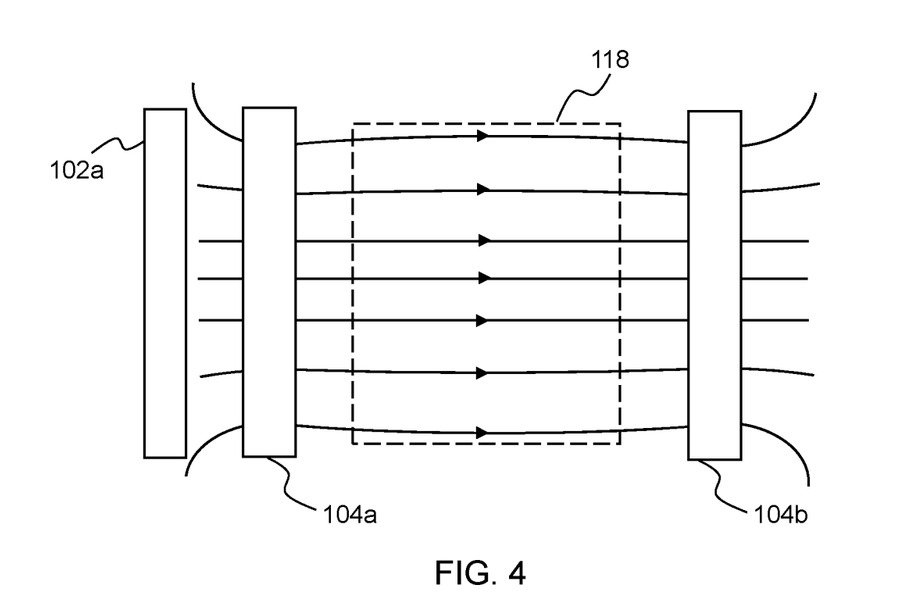
FIG. 4 is a schematic diagram of a plan view of the portion of the example apparatus of FIG. 3, but including illustrative magnetic field lines.

In some examples, the plasma 112 substantially conforms to a curvature of at least part of a curved surface of the curved member 118. For example, as shown in FIGS. 2 and 4, the magnetic field lines describing the confining magnetic field may each be curved so as to substantially conform to the curvature of at least part of the curved surface of the curved member 118, e.g. so as to substantially follow the curve of the curved path C. In such examples, it will be appreciated that, in principle, the whole or entire magnetic field provided by the magnetic elements 104a, 104b, 104c may comprise portions which may be described by magnetic field lines which are not arranged to conform to the curvature of at least part of the curved surface of the curved member 118, e.g. follow the curve of the curved path C. Nonetheless, in such examples the confining magnetic field provided, i.e. the part of the entire or whole magnetic field provided by the magnetic elements 104a, 104b, 104c that confines the plasma 112 into the sputter deposition zone 114, is described by magnetic field lines that substantially conform to the curvature of at least part of the curved surface of the curved member 118.

In some examples, the magnetic field lines describing the confining magnetic field may be arranged to conform to, e.g. follow, the curve of the curved member or roller 118 around a substantial or significant sector or portion of the curved member 118, e.g. over all or a substantial part of the notional sector of the curved member 118 that carries or contacts the substrate 116 in use. For example, the curved member 118 may be substantially cylindrical in shape, and magnetic field lines describing the confining magnetic field may be arranged to follow the curve of the curved member 118 around at least about 1/16 or at least about 1/8 or at least about 1/4 or at least about 1/2 of the circumference of the curved member 118. For example, the magnetic field lines describing the confining magnetic field in FIG. 2 follow a curved path around about at least 1/4 of the circumference of the curved member 118. Thus, in examples, the plasma 112 may substantially conform to a curvature of around at least about 1/16 or at least about 1/8 or at least about 1/4 or at least about 1/2 of the curved surface, e.g. circumference, of the curved member 118.

In some cases, the magnet arrangement 104 is configured to confine the plasma 112 around the curved member 118 and into the pre-treatment zone 117. For example, the plasma source 102 may be separated from the pre-treatment zone 117 by a substantial or significant sector or portion of the curved member 118, e.g. over all or a substantial part of the notional sector of the curved member 118 that carries or contacts the substrate 116 in use. In some cases, the separation may be at least about 1/16 or at least about 1/8 or at least about 1/4 or at least about 1/2 of the circumference of the curved member 118. The magnet arrangement 104 may thus be configured to confine the plasma 112 around the substantial or significant sector or portion of the curved member 118, and into the pre-treatment zone 117, for pre-treatment of the substrate 116 in use.

In examples, the magnet arrangement 104 is configured to confine the plasma 112 to extend between the pre-treatment and sputter deposition zones 114, 117 about the guiding member 118. For example, the pre-treatment and sputter deposition zones 114, 117 may be separated from one another by a substantial or significant sector or portion of the guiding member, e.g. curved member, 118. In some cases, the separation may be at least about 1/16 or at least about 1/8 or at least about 1/4 or at least about 1/2 of the circumference of the curved member 118.

In examples, the one or more magnetic elements 104a, 104b, 104c may be arranged such that the plasma source 102 separates a first subset of the magnetic elements 104a, 104b, 104c from a second subset of the magnetic elements 104a, 104b, 104c. For example, FIG. 1 shows one of the magnetic elements 104c separated from the other magnetic elements 104a, 104b by the plasma source 102 located therebetween. The first subset 104c of the magnetic elements 104a, 104b, 104c may be configured to confine the plasma 112 from the plasma source 102 to the pre-treatment zone 117, for example. The second subset 104a, 104b of the magnetic elements 104a, 104b, 104c may be configured to confine the plasma 112 from the plasma source 102 to the sputter deposition zone 114, for example. Together, the magnetic elements 104a, 104b, 104c are configured to confine the plasma 112 to the pre-treatment and sputter deposition zones 114, 117 as described herein.

Where the curve of the curved path C is referenced in certain examples, this may be understood as the degree to which the path along which the substrate guide 118 carries the substrate 116 is curved. For example, the curved member 118, such as a drum or roller, may carry the substrate 116 along the curved path C. In such examples, the curve of the curved path C may result from the degree to which the curved surface of the curved member 118 that carries the substrate 116 is curved, e.g. deviates from a flat plane. In other words, the curve of the curved path C may be understood as the degree to which the curved path C that the curved member 118 causes the substrate 116 to follow is curved. To substantially follow the curve of the curved path C may be understood as to substantially conform to or replicate the curved shape of the curved path C. For example, magnetic field lines may follow a curved path that has a common centre of curvature with the curved path C, but which has a different (in the illustrated examples larger) radius of curvature than the curved path C. For example, the magnetic field lines may follow a curved path that is substantially parallel to, but radially offset from, the curved path C of the substrate 116. In examples, the magnetic field lines may follow a curved path that is substantially parallel to, but radially offset from, the curved surface of the curved member 118. For example, the magnetic field lines describing the confining magnetic field in FIG. 2 follow a curved path, at least in the sputter deposition zone 114, that is substantially parallel to, but radially offset from, the curved path C, and hence which substantially follows the curve of the curved path C.

The magnetic field lines describing the confining magnetic field may be arranged to follow the curve of the curved path C around a substantial or significant sector or portion of the curved path C, for example over all or a substantial part of the notional sector of the curved path C, over which the substrate 116 is guided by the curved member 118. For example, the curved path C may represent a portion of a circumference of a notional circle, and magnetic field lines characterising the confining magnetic field may be arranged to follow the curve of the curved path C around at least about 1/16 or at least about 1/8 or at least about 1/4 or at least about 1/2 of the circumference of the notional circle.

Confining the generated plasma 112 to substantially conform to a curvature of at least part of a curved surface of the curved member 118, e.g. follow a curve of the curved path C, may allow for more uniform distribution of plasma density at the substrate 116 at least in a direction around the curved surface of the curved member 118, e.g. the curve of the curved path C. This may in turn allow for a more uniform sputter deposition onto the substrate 116 in a direction around the curved member 118, e.g. the curved path C. The sputter deposition may therefore, in turn, be performed more consistently. This may, for example, improve the consistency of the processed substrate, and may for example, reduce the need for quality control. This may be as compared to, for example, magnetron type sputter deposition apparatuses where the magnetic field lines describing the magnetic field produced thereby loop tightly into and out of a substrate, and hence do not allow to provide uniform distribution of plasma density at the substrate.

Alternatively, or additionally, confining the generated plasma 112 to substantially conform to a curvature of at least part of a curved surface of the curved member 118, e.g. follow a curve of the curved path C, may allow for an increased area of the substrate 116 to be exposed to the plasma 112, and hence for an increased area in which sputter deposition may be effected. This may allow, for example, for the substrate 116 to be fed through a reel-to-reel type apparatus at a faster rate for a given degree of deposition, and hence allow for more efficient sputter deposition.

In some examples, the magnet arrangement (or "magnetic confining arrangement") 104 may comprise at least two magnetic elements 104a, 104b arranged to provide a magnetic field. For example, the at least two magnetic elements 104a, 104b may be arranged such that a region of relatively high magnetic field strength defined between the at least two magnetic elements 104a, 104b is in the form of a sheet. That is, in a form in which the depth (or thickness) of the plasma 112 is substantially less than its length or width. The thickness of the sheet of plasma 112 may be substantially constant along the length and width of the sheet. The density of the sheet of plasma 112 may be substantially uniform in one or both of its width and length directions.

In some examples, a region of relatively high magnetic field strength provided between the at least two magnetic elements 104a, 104b substantially conforms to the curvature of at least part of the curved surface of the curved member 118, e.g. substantially follows the curve of the curved path C.

In the example illustrated schematically in FIGS. 1 and 2, two magnetic elements 104a, 104b are located on opposite sides of the drum 118 to one another, and each is disposed above a lowermost portion of the drum 118 (in the sense of FIG. 1). The two magnetic elements 104a, 104b confine the plasma 112 to conform to the curvature of at least part of the curved surface of the curved member 118, e.g. follow the curve of the curved path C, on both sides of the curved member 118, for example a feed-on side where the substrate 116 is fed onto the curved member 118, and a feed-off side in where the substrate 116 is fed off of the curved member 118. Having at least two magnetic elements may therefore provide for a (further) increase in the area of the substrate 116 that is exposed to plasma 112 in the sputter deposition zone 114, and hence increased area in which sputter deposition may be effected. This may allow for the substrate 116 to be fed through a reel-to-reel type apparatus at a (still) faster rate for a given degree of deposition, and hence allow for more efficient sputter deposition, for example.

As described, in some examples a first subset of the magnetic elements 104a, 104b, 104c may be disposed on an opposite side of the plasma source 102 to a second subset of the magnetic elements 104a, 104b, 104c. For example, the magnet arrangement 104 may comprise at least three magnetic elements 104a, 104b, 104c arranged to provide the magnetic field. At least two of the at least three magnetic elements 104a, 104b, 104c, shown as the two magnetic elements 104a, 104b in the Figures, may be arranged to provide the magnetic field which impinges on the sputter deposition zone 114, as described in examples above. At least one of the at least three magnetic elements 104a, 104b, 104c, shown as the magnetic element 104c in the Figures, may be arranged to provide the magnetic field which impinges on the pre-treatment zone 117. The at least two magnetic elements 104a, 104b of the at least three magnetic elements 104a, 104b, 104c may therefore be configured to confine the plasma 112 to at least the sputter deposition zone 114, whereas the at least one magnetic element 104c of the at least three magnetic elements 104a, 104b, 104c may be configured to confine the plasma 112 to at least the pre-treatment zone 117. Together, the at least three magnetic elements 104a, 104b, 104c are configured to confine the plasma 112 to the pre-treatment and sputter deposition zones 114, 117 as described herein.

In some examples, one or more of the magnetic elements 104a, 104b, 104c may be an electromagnet 104a, 104b, 104c. The apparatus 100 may comprise a magnetic controller (not shown) to control a magnetic field strength of, e.g. provided by, one or more of the electromagnets 104a, 104b, 104c. This may allow for the arrangement of the magnetic field lines describing the confining magnetic field to be controlled. This may allow for adjustment of the plasma density at the substrate 116 and or the target material 108 within the sputter deposition zone 114, and hence allow for improved control over the sputter deposition. This may in turn allow for improved flexibility in the operation of the sputter deposition apparatus 100. Furthermore, controlling the magnetic field strength provided by the magnet arrangement 104 can similarly allow for adjustment of the plasma density at the substrate 116 within the pre-treatment zone 117. This may in turn allow for improved control of the pre-treatment process, e.g. an amount of ablation, and add to the flexibility in the operation of the sputter deposition apparatus 100 such that different types of substrate and/or target materials may be utilised. As well as plasma density within the pre-treatment zone 117, controlling the arrangement of the magnetic field lines describing the confining magnetic field provided by the magnet arrangement 104, allows for a shape of the plasma 112 to be controlled within the pre-treatment zone 117. This may in turn allow for the dimensions of the pre-treatment zone 117 to be adjusted, e.g. the size of the region of substrate 116 that is exposed to the plasma at any one time in use. Thus, yet further flexibility in the operation of the sputter deposition apparatus 100 can be provided such that different types of substrate and/or target materials may be utilised.

In some examples, one or more of the magnetic elements 104a, 104b, 104c may be provided by a solenoid 104a, 104b, 104c. In examples, the solenoid 104a, 104b, 104c may be elongate in cross section. For example, the solenoid 104a, 104b, 104c may be elongate in cross section in a direction substantially parallel to an axis of rotation of the curved member 118, e.g. roller 118. Each solenoid 104a, 104b, 104c may define an opening through which plasma 112 passes (is confined) in use. As per the example illustrated schematically in FIGS. 1 and 2, there may be three solenoids 104a, 104b, 104c and each solenoid 104a, 104b, 104c may be angled so that a region of relatively high magnetic field strength is provided between the solenoids 104a, 104b, 104c, e.g. to substantially follow the curve of the curved path C. In such a way, as illustrated in FIG. 1, in one direction the generated plasma 112 may pass through a first of the solenoids 104a, under the drum 118 (in the sense of FIG. 1) into the deposition zone 114, and up towards and through the second of the solenoids 104b. In another direction the generated plasma 112 may pass through the first of the solenoids 104a, about the drum 118 into the pre-treatment zone 117, and up towards and through the third of the solenoids 104c.

Although only three magnetic elements 104a, 104b, 104c are shown in FIGS. 1 and 2, it will be appreciated that further magnetic elements (not shown), e.g. further such solenoids, may be placed along the path of the plasma 112. This may allow for strengthening of the confining magnetic field and hence for precise confining and/or may allow for more degrees of freedom in the control of the confining magnetic field.

In examples, as shown in FIGS. 1 and 2, the sputter deposition apparatus 100 comprises a target portion 106 arranged to support the target material 108. The deposition zone 114 may be located between the target portion 106 and the guiding member 118 in such cases. For example, the target portion 106 and the guiding member 118 may be spaced apart from one another such that the deposition zone 114 is formed between them. The deposition zone 114 may be taken as the area or volume in the apparatus 100, e.g. between the guiding member 118 and the target portion 106, in which sputter deposition from the target material 108 onto the substrate 116 occurs in use.

In some examples, the target portion 106 may comprise a plate or other support structure that supports or holds the target material 108 in place during sputter deposition. The target material 108 may be a material based on which the sputter deposition onto the substrate 116 is to be performed. For example, the target material 108 may be, or comprise, material that is to be deposited onto the substrate 116 by sputter deposition.

In some examples, e.g. for the production of an energy storage device, the target material 108 may be or comprise, or may be or comprise a precursor material for, a cathode layer of an energy storage device, such as a material which is suitable for storing lithium ions, e.g. lithium cobalt oxide, lithium iron phosphate or alkali metal polysulphide salts. Additionally, or alternatively, the target material 108 may be or comprise, or may be or comprise a precursor material for, an anode layer of an energy storage device, such as lithium metal, graphite, silicon or indium tin oxides. Additionally, or alternatively, the target material 108 may be or comprise, or may be or comprise a precursor material for, an electrolyte layer of an energy storage device, such as a material which is ionically conductive, but which is also an electrical insulator, e.g. lithium phosphorous oxynitride (LiPON). For example, the target material 108 may be, or comprise, LiPO as a precursor material for the deposition of LiPON onto the substrate 116, e.g. via reaction with nitrogen gas in the region of the target material 108.

In some examples, the magnet arrangement 104, e.g. comprising one or more magnetic elements 104a, 104b, 104c, is configured to confine the plasma 112 in the form of a sheet. For example, the magnet arrangement 104 may be arranged to provide the magnetic field so as to confine the plasma 112 in the form of a sheet. In some examples, the magnet arrangement 104 is configured to confine the plasma 112 in the form of a sheet having a substantially uniform density, e.g. at least in the deposition zone 114 and/or pre-treatment zone 117. In certain cases, the magnet arrangement 104 is configured to confine the plasma 112 in the form of a curved sheet.

Figure 5:
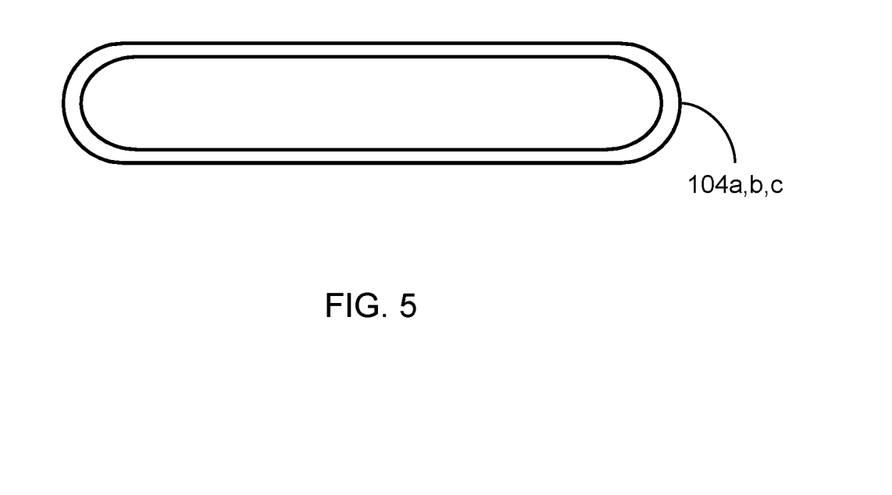
FIG. 5 is a schematic diagram of a cross section of a magnetic element according to an example.

For example, as illustrated in FIGS. 4 and 5, in some examples one or more of the solenoids 104a, 104b, 104c may be elongate in a direction substantially perpendicular to a direction of the magnetic field lines produced internally thereof in use. For example, as perhaps best seen in FIGS. 3 to 5, the solenoids 104a, 104b, 104c may each have an opening via which plasma 112 is confined in use (through which plasma 112 passes in use), where the opening is elongate in a direction substantially parallel to a longitudinal axis 120 of the curved member 118. As perhaps best seen in FIGS. 3 and 4, the elongate antennae 102a, 102b may extend parallel to and in line with the solenoids 104a, 104b, 104c. As described above, plasma 112 may be generated along the length of the elongate antennae 102a, 102b, and the elongate solenoids 104a, 104c may confine, e.g. guide, the plasma 112 in a direction away from the elongate antennae 102a, 102b, and through the respective elongate solenoids 104a, 104c.

The plasma 112 may be confined, e.g. guided, from the elongate antennae 102a, 102b by the elongate solenoids 104a, 104c in the form of a sheet. That is, in a form in which the depth (or thickness) of the plasma 112 is substantially less than its length or width. The thickness of the sheet of plasma 112 may be substantially constant along the length and width of the sheet. The density of the sheet of plasma 112 may be substantially uniform in one or both of its width and length directions. The plasma 112, in the form of a sheet, may be confined by the magnetic field provided by the solenoids 104a, 104b, 104c around the curved member 118 so as to substantially conform to the curvature of a curved surface of the curved member 118, e.g. follow the curve of the curved path C, into the deposition zone 114 and the pre-treatment zone 117. The plasma 112 may thereby be confined in the form of a curved sheet in some cases, as referenced above. The thickness of such a curved sheet of plasma 112 may be substantially constant along the length and width of the curved sheet. The plasma 112 in the form of a curved sheet may have a substantially uniform density, for example the density of the plasma 112 in the form of a curved sheet may be substantially uniform in one or both of its length and width.

Confining the plasma in the form of a curved sheet may allow for an increased area of the substrate 116 carried by the curved member 118 to be exposed to the plasma 112, and hence for an increased area in which sputter deposition may be effected. This may allow, for example, for the substrate 116 to be fed through a reel-to-reel type apparatus at a (still) faster rate for a given degree of deposition, and hence for more efficient sputter deposition.

Confining the plasma 112 in the form of a curved sheet, for example a curved sheet having a substantially uniform density (e.g. at least in the sputter deposition zone 114) may alternatively or additionally allow for a more uniform distribution of plasma density at the substrate 116, e.g. in both of a direction around the curve of the curved member 118, and over the length of the curved member 118. This may in turn allow for a more uniform sputter deposition onto the substrate 116, e.g. in a direction around the surface of the curved member 118 and across the width of the substrate 116. The sputter deposition may therefore, in turn, be performed more consistently. This may, for example, improve the consistency of the processed substrate, and may for example, reduce the need for quality control. This may be as compared to, for example, magnetron type sputter deposition apparatuses where the magnetic field lines characterising the magnetic field produced thereby loop tightly into and out of a substrate, and hence do not allow to provide uniform distribution of plasma density at the substrate.

In some examples, the confined plasma 112 may, at least in the deposition zone 114, be high density plasma. For example, the confined plasma 112 (in the form of a curved sheet or otherwise) may have, at least in the deposition zone 114, a density of $10^{11}$ cm$^{-3}$ or more, for example. Plasma 112 of high density in the deposition zone 114 may allow for effective and/or high rate sputter deposition.

In the examples illustrated in FIGS. 1 to 5, the target portion 106 and the target material 108 supported thereby are substantially planar. However, in some examples (as described in more detail below) the target portion 106 may be arranged, or may be configurable to be arranged, such that at least one part of the target portion 106 defines a supporting surface forming an obtuse angle with respect to a supporting surface of another part of the target portion. For example, the target portion 106 may be substantially curved. For example, the target portion may be arranged to substantially conform to the curvature of at least part of a curved surface of the curved member 118, e.g. follow the curve of the curved path C, as shown in FIG. 6.

Figure 6:
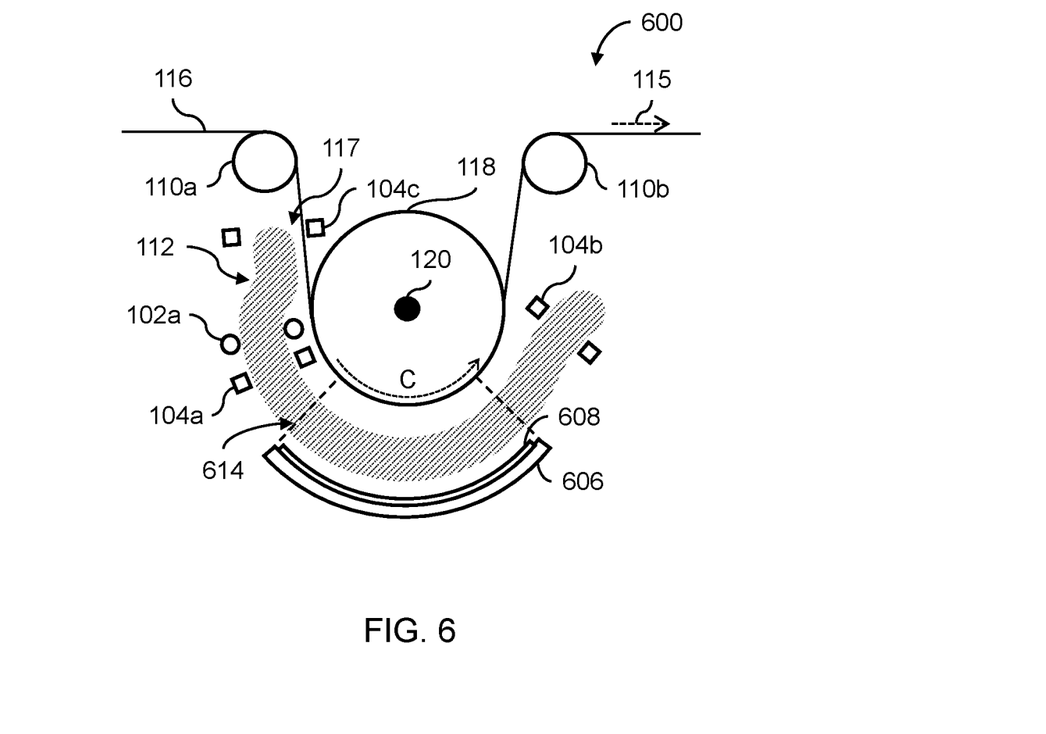
FIG. 6 is a schematic diagram of a cross section of an apparatus according to an example.

FIG. 6 illustrates another example sputter deposition apparatus 600. Many of the illustrated components of the apparatus 600 are the same as those of the apparatus 100 illustrated in FIGS. 1 to 5 and described above; the same relevant descriptions therefore apply. Like features are given like reference signs, and it will be appreciated that any feature of the examples described with reference to FIGS. 1 to 5 may be applied to the example illustrated in FIG. 6.

However, in the example illustrated in FIG. 6, the target portion 606 is substantially curved. The target material 608 supported by the target portion 606 is accordingly substantially curved in this example. In this case, any one part of the curved target portion 606 forms an obtuse angle with any other part of the curved target portion 606 along the direction of the curve. In some examples, different parts of the target portion 606 may support different target materials, for example to provide for a desired arrangement or composition of deposition to the substrate 116.

In some examples, the curved target portion 606 may substantially follow the curve of the curved path C. For example, the curved target portion 606 may substantially conform to or replicate the curved shape of the curved path C. For example, the curved target portion 606 may have a curve that is substantially parallel to but radially offset from the curved path. For example, the curve target portion 606 may have a curve that has a common centre of curvature to the curved path C, but a different, in the illustrated examples larger, radius of curvature to the curved path C. Accordingly, the curved target portion 606 may in turn substantially follow the curve of the curved plasma 112 confined around the curved member 118 in use. Put another way, in some examples, the plasma 112 may be confined by the magnetic elements 104a, 104b of the confining arrangement to be located between the path C of the substrate 116 and the target portion 606, and substantially follow the curve of both the curved path C and the curved target portion 606.

As for the target portion 108 of the apparatus 100 illustrated in FIGS. 1 to 5, it will be appreciated that the example target portion 606 of FIG. 6 (and accordingly the target material 608 supported thereby) may extend substantially across an entire length of the curved member 118 (e.g. in a direction parallel with the longitudinal axis 120 of the drum 118). This may allow to maximise the surface area of the substrate 116 carried by the drum 118 onto which target material 608 may be deposited.

As mentioned, the plasma 112 may be confined to substantially follow the curve of both the curved path C and the curved target portion 606. The area or volume between the curved path C and the curved target portion 606 may accordingly be curved around the curved member 118. The deposition zone 614 may therefore represent a curved volume in which sputter deposition of the target material 608 to the substrate 116 carried by the curved member 118 occurs in use. This may allow for an increase of the surface are of the web of substrate 116 carried by the curved member 118 present in the deposition zone 614 at any one time. This in turn may allow for an increase in the surface area of the web of substrate 116 onto which target material 608 may be deposited in use. This in turn may allow for an increased area in which sputter deposition may be effected, but without substantially increasing the spatial footprint of the target portion 606, and without altering the dimensions of the curved member 118. This may allow, for example, for the web of substrate 116 to be fed through a reel-to-reel type apparatus at a (still) faster rate for a given degree of deposition, and hence for more efficient sputter deposition, but also in a space efficient way.

Figure 7:
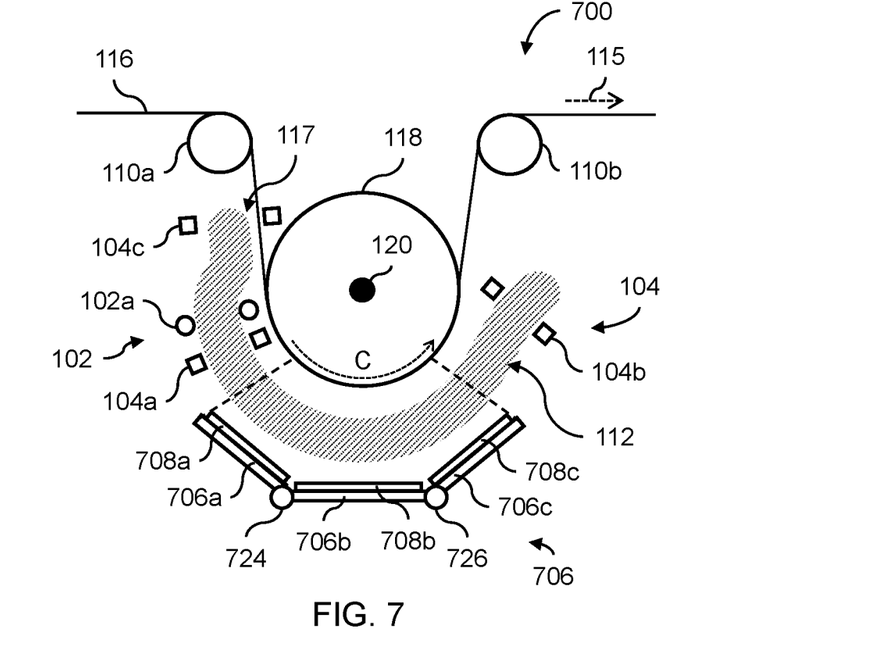
FIG. 7 is a schematic diagram of a cross section of an apparatus according to an example.

FIG. 7 illustrates another example sputter deposition apparatus 700. Many of the illustrated components of the apparatus 700 are the same as those of the apparatus 100 illustrated in FIGS. 1 to 6 and described above and will not be described again. Like features are given like reference signs, and it will be appreciated that any feature of the examples described with reference to FIGS. 1 to 6 may be applied to the example illustrated in FIG. 7. However, in the example illustrated in FIG. 7, the target portion 706 is arranged, or configurable to be arranged, such that at least one part 706a of the target portion 706 defines a surface forming an obtuse angle with respect to a surface of another part 706b of the target portion 706.

In some examples, an angle that a first part 706a of the target portion 706 makes with a second, for example adjacent, part 706b of the target portion 706 may be fixed at an obtuse angle. The obtuse angle may be chosen such that the first part 706a and the second part 706b together are arranged so as to approximate the curvature of at least part of a curved surface of the curved member 118, e.g. the curve of the curved path C. As illustrated in the example of FIG. 7, the target portion 706 may comprise, for example, three (substantially planar as illustrated in FIG. 7) parts 706a, 706b, 706c with each part making an obtuse angle with respect an adjacent part. A first part 706a may be disposed towards the feed-in side of the curved member 118, a second part 706b may be disposed towards a central portion of the curved member 118, and a third part 706c may be disposed towards a feed-off side of the curved member 118. The three parts 706a, 706b, 706c together may be arranged so as to approximate the curvature of at least part of a curved surface of the curved member 118, e.g. the curve of the curved path C. The deposition zone 714 may therefore approximate a curved volume in which sputter deposition of the target material 708a, 708b, 708c to the substrate 116 occurs in use. A surface area of the substrate 116 present in the deposition zone 714 at any one time may thereby be increased. This may allow for an increased area in which sputter deposition may be effected, but without substantially increasing the spatial footprint of the target portion 706, and without altering the dimensions of the curved member 118, for example.

In some examples, the target portion 706 is configurable to be arranged such that at least one part 706a of the target portion 706 defines a surface forming an obtuse angle with respect to a surface of another part 706b of the target portion 706. For example, an angle that a first part 706a of the target portion 706 makes with a second, for example adjacent, part 706b of the target portion 706 may be configurable. For example, the first part 706a and the second part 706b may be mechanically connected by a hinge element 724 or other such component that allows the angle between the first part 706a and the second part 706b to be changed. Similarly, the second part 706b and the third part 706c may be mechanically connected by a hinge element 726 or other such component that allows the angle between the second part 706b and the third part 706c to be changed. An actuator and suitable controller (not shown) may be provided to move the first part 706a and/or the third part 706c relative to the second part 706b, e.g. to alter the angle made between the first part 706a and/or the third part 706c relative to the second part 706b. This may allow for control of the plasma density experienced by the respective target material 708a, 708c of the first part 706a or third part 706c of the target portion, and hence may allow for control of the deposition rate in use.

Alternatively, or additionally, the confining magnetic field provided by the magnetic elements 104a, 104b, 104c may be controlled by a controller (not shown) to alter the curvature of the plasma 112 and thereby control the density of plasma experienced by the respective target material(s) 708a, 708b, 708c of the first part 706a, second part 706b, or third part 706c of the target portion, and hence may allow for control in the deposition rate in use.

In some examples, the target material provided on one part 706a, 706b, 706c of the target portion 706 may be different to the target material provided on another part 706a, 706b, 706c of the target portion. This may allow for a desired arrangement or composition of target material to be sputter deposited onto the substrate 116. Control of the plasma density experienced by one or more of the target portions 706a, 706b, 706c, for example by control of the angle that the first part 706a or third part 706c makes with the second part 706b, and/or by control of the curvature of the confined plasma via control of the magnetic elements 104a, 104b, 104c may allow for control of the type or composition of target material that is sputter deposited onto the substrate 116. This may allow for flexible sputter deposition.

In some examples, the magnetic field lines describing the confining magnetic field may be arranged such that an imaginary line, extending perpendicularly to each magnetic field line and connecting the magnetic field lines, is curved so as to, at least in the sputter deposition zone, substantially follow the curve of the curved path C, e.g. the curvature of at least part of the curved surface of the curved member 118.

Figure 8:
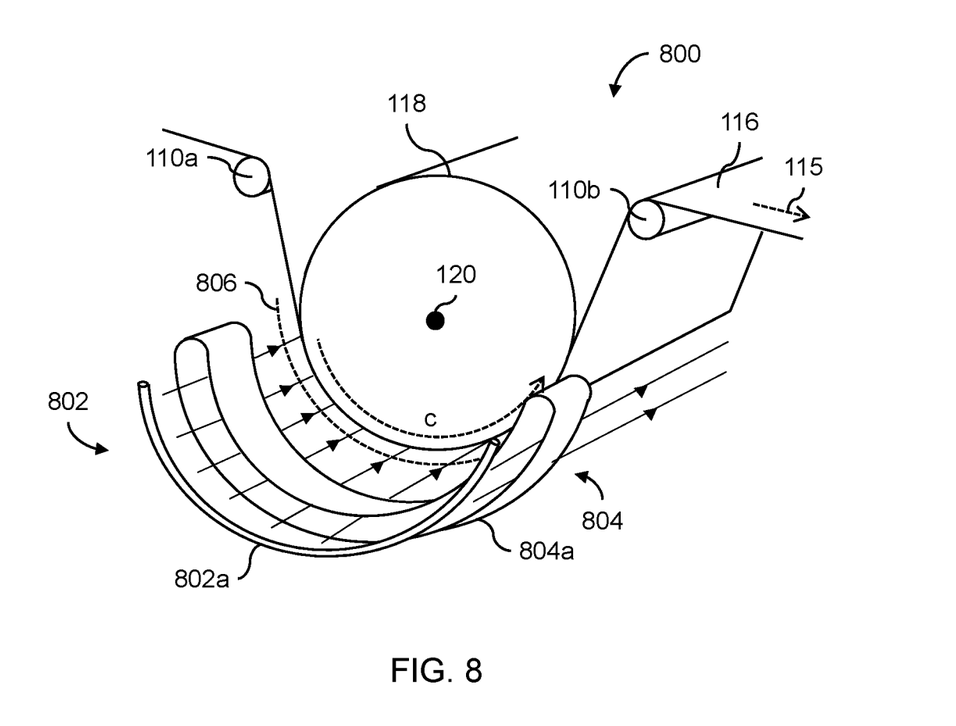
FIG. 8 is a schematic diagram of a perspective view of an apparatus according to an example.

For example, FIG. 8 illustrates another example sputter deposition apparatus 800. Many of the illustrated components of the apparatus 800 may be the same as those of the apparatus 100 illustrated in FIGS. 1 to 7 and described above; the same relevant descriptions therefore apply. Like features are given like reference signs, and it will be appreciated that any feature of the examples described with reference to FIGS. 1 to 7 may be applied to the example illustrated in FIG. 8. However, in the example illustrated in FIG. 8, a magnetic element 804a of a magnet arrangement 804 is arranged to provide a confining magnetic field, wherein the magnetic field lines (black arrows in FIG. 8) describing, e.g. characterising, the confining magnetic field are each themselves substantially straight but are arranged such that an imaginary line 806, extending perpendicularly to each magnetic field line and connecting the magnetic field lines, is curved so as to, at least in the deposition zone (not indicated explicitly in FIG. 8 for clarity), substantially follow the curve of the curved path C, e.g. the curvature of at least part of the curved surface of the curved member 118.

The plasma generation arrangement 802 may comprise one or more elongate antennae 802a that are curved and extend in a direction substantially perpendicular to a longitudinal axis 120 of the curved member or drum 118. In the example of FIG. 8 the longitudinal axis 120 of the curved member 118 is also the rotation axis of the curved member 118. Only one antenna 802a is shown in FIG. 8 for clarity but it will be appreciated that more than one such antennae 802a may be used. The curved antenna 802a may substantially follow the curve of the curved path C, e.g. substantially conform to the curvature of at least part of the curved surface of the curved member 118. For example, the curved antenna 802a may be parallel to but radially and axially offset from the curved path C, e.g. parallel to but radially and axially offset from the curved surface of the curved member 118 that guides the substrate along the curved path C. The curved antenna 802a may be driven with RF power to produce plasma (not shown in FIG. 8 for clarity) having a substantially curved shape.

The magnetic element 804a may comprise a solenoid 804a. Only one magnetic element 804a is shown in FIG. 8 for clarity, but it will be appreciated that, for example, another such magnetic element (not shown) may be placed on the opposite side of the curved member 118 to the solenoid 804a in the sense of FIG. 8. The solenoid 804a may have an opening through which plasma (not shown in FIG. 8) is confined, e.g. guided, in use. The opening may be curved and elongate in a direction substantially perpendicular to the longitudinal axis (rotational axis) 120 of the curved member 118. The curved solenoid 804a may substantially follow the curve of the curved path C. For example, the curved solenoid 804a may be parallel to but radially and axially offset from the curved surface of the curved member 118. The curved solenoid 804a may be disposed intermediate of the curved antenna 802a and the curved member 118. The curved solenoid 804a provides a confining magnetic field in which the field lines are arranged such that an imaginary line 806, extending perpendicularly to each magnetic field line and connecting the magnetic field lines, is curved so as to, at least in the deposition zone, substantially follow the curve of the curved path C.

Plasma (not shown in FIG. 8) may be generated along the length of the curved antenna 802a, and the curved solenoid 804a may confine the plasma (not shown in FIG. 8) in a direction away from the curved antenna 802a and through the curved solenoid 804a. The plasma may be confined by the curved solenoid 804a in the form of a curved sheet. In this case, the length of the curved sheet extends in a direction parallel to the longitudinal (rotational) axis 120 of the curved member 118. The plasma, in the form of a curved sheet, may be confined by the magnetic field provided by the solenoid 804a around the curved member 118 and so as to replicate the curve of the curved member 118. The thickness of the curved sheet of plasma may be substantially constant along the length and width of the curved sheet. The plasma in the form of a curved sheet may have a substantially uniform density, for example the density of the plasma in the form of a curved sheet may be substantially uniform in one or both of its length and width. As described above, the plasma being confined in the form of a curved sheet may allow for an increased area in which sputter deposition may be effected and hence for more efficient sputter deposition, and/or for a more uniform distribution of plasma density at the substrate 116, for example in both of a direction around the curved of the curved member, and across the width of the substrate 116. This may in turn allow for a more uniform sputter deposition onto the web of substrate 116, e.g. in a direction around the surface of the curved member 118 and across the length of the curved member 118, which may improve the consistency of the processing of the substrate.

The magnet arrangement 804, e.g. comprising one or more magnetic elements 804a, is configured to confine the plasma within the apparatus 800 to the pre-treatment zone as well as the sputter deposition zone, where the pre-treatment and sputter deposition zones are disposed about the guiding member 118, as described in the other examples. Although not shown explicitly in FIG. 8 for clarity, the one or more magnetic elements 804a may be arranged to provide a confining magnetic field to confine plasma to both the pre-treatment and sputter deposition zones. For example, as described above, the plasma may be confined by the curved solenoid 804a in the form of a curved sheet. The plasma in the form of a curved sheet may be directed, by the magnet arrangement 804 including the curved solenoid 804a, about the guiding member, comprising a curved member 118, and into the pre-treatment zone (not indicated explicitly in FIG. 8 for clarity). As in other examples, the pre-treatment zone is located before the sputter deposition zone in the conveyance direction 115.

Figure 9:
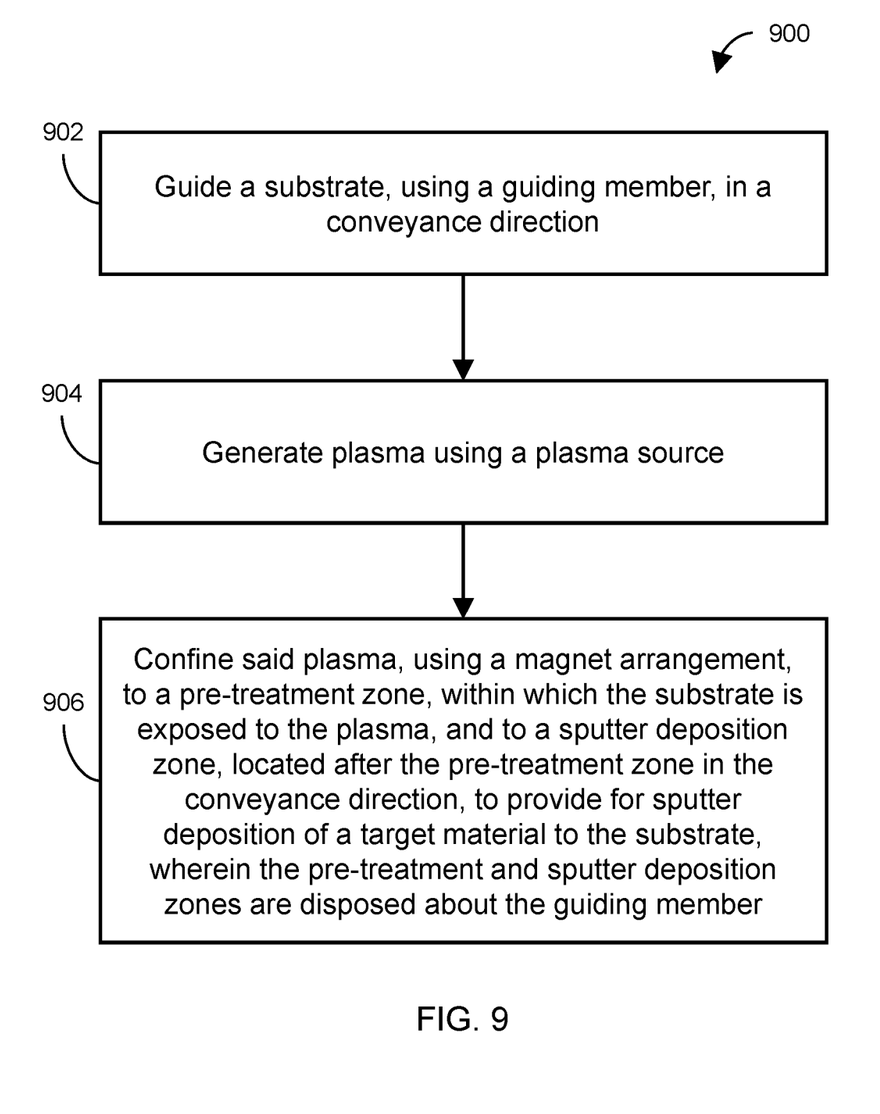
FIG. 9 is a schematic flow diagram of a method according to an example.

Referring to FIG. 9, an example sputter deposition method 900 is illustrated in a flow diagram. In the method 900, a substrate is guided in a conveyance direction using a guiding member. Plasma is generated, using a plasma source, and confined by a magnet arrangement to pre-treatment and sputter deposition zones which are disposed about the guiding member. In the pre-treatment zone, the substrate is exposed to the plasma and in the sputter deposition zone, located after the pre-treatment zone in the conveyance direction, sputter deposition of a target material to the substrate is provided for.

The target material, the substrate, the guiding member, the plasma source, the magnet arrangement the pre-treatment zone, and the sputter deposition zone, may be, for example, those of any of the examples described above with reference to FIGS. 1 to 8. In some examples, the method may be performed by any one of the apparatuses 100, 600, 700, 800 described with reference to FIGS. 1 to 8.

The method involves, in step 902, guiding a substrate, using a guiding member, in a conveyance direction. For example, the substrate may be guided by the guiding member, e.g. curved member, 118 described above with reference to FIGS. 1 to 8.

In step 904, the method comprises generating plasma using a plasma source. For example, the plasma may be generated by one of the plasma generation arrangements 102, 802 described above with reference to FIGS. 1 to 8.

In step 906, the method comprises confining the plasma, using a magnet arrangement, to a pre-treatment zone and to a sputter deposition zone, located after the pre-treatment zone in the conveyance direction, wherein the pre-treatment and sputter deposition zones are disposed about the guiding member. For example, the plasma may be confined by one of the magnet arrangements 104, 804 described above with reference to FIGS. 1 to 8. Within the pre-treatment zone, the substrate is exposed to the plasma. The sputter deposition zone provides for sputter deposition of a target material to the substrate.

As mentioned, confining the generated plasma in this way, with the pre-treatment and sputter deposition zones disposed about the guiding member, may allow for more efficient use of generated plasma and thus a more efficient sputter deposition process, but also in a space-efficient manner. For example, disposing the pre-treatment and sputter deposition zones about the guiding member can reduce the need for further components which can take up more space, add to the overall energy requirements, and make the apparatus more complex to run and maintain. For example, confining the generated plasma in this way allows the same plasma source to be used for both pre-treating the substrate and providing for sputter deposition of target material 108 thereto. Furthermore, the same guiding member can be used to provide for the separate pre-treatment and deposition zones, thus saving space and energy requirements compared to e.g. using separate plasma sources and/or guiding members, given the control provided by the magnet arrangement confining the plasma.

The above examples are to be understood as illustrative examples of the invention. Further embodiments are envisaged. For example, many of the described examples utilise a curved member for guiding the substrate. The curved member, e.g. a roller or drum, may form part of, or work with, a roll-to-roll system for conveying the substrate. In certain cases, the curved member may not be a roller as such but may nonetheless define a curved path along which the substrate can be conveyed. However, although in some instances a curved guiding member is preferable, embodiments are also envisaged in which this is not the case, e.g. where a roll-to-roll system is not implemented. Such embodiments of the sputter deposition apparatus or method may thus be implemented in systems utilising sheet-to-sheet and/or substrate-supported laser lift technology as described in KR20130029488, for example.

It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the invention, which is defined in the accompanying claims.

The invention claimed is:

1. A sputter deposition apparatus comprising:
a guiding member to guide a substrate in a conveyance direction, wherein the guiding member is a curved member having a curved surface, wherein the curved member comprises a roller having a circumference;
a plasma source to generate a plasma;
a magnet arrangement configured to confine the plasma within the apparatus to:
a pre-treatment zone, within which the substrate is exposed to the plasma in use; and
a sputter deposition zone, located after the pre-treatment zone in the conveyance direction, to provide for sputter deposition of a target material to the substrate in use;
wherein the pre-treatment and sputter deposition zones are separated about and disposed about the guiding member, and
wherein the magnet arrangement is configured to provide the plasma such that the plasma substantially conforms to a curvature of at least ¼ of the circumference of the roller.

2. The sputter deposition apparatus according to claim 1, wherein the magnet arrangement is configured to confine the plasma within the pre-treatment zone to interact with at least part of a surface of the substrate in use.

3. The sputter deposition apparatus according to claim 1, wherein within the pre-treatment zone the plasma interacts with the substrate in an ablative process in use.

4. The sputter deposition apparatus according to claim 1, wherein the magnet arrangement is configured to confine the plasma to extend between the pre-treatment and sputter deposition zones about the guiding member.

5. The sputter deposition apparatus according to claim 1, comprising a target portion arranged to support the target material, wherein the deposition zone is located between the target portion and the guiding member.

6. The sputter deposition apparatus according to claim 1, wherein the magnet arrangement is configured to confine the plasma in the form of a sheet.

7. The sputter deposition apparatus according to claim 1, wherein the magnet arrangement is configured to confine the plasma around the curved member in the sputter deposition zone and into the pre-treatment zone.

8. The sputter deposition apparatus according to claim 1, wherein the magnet arrangement comprises one or more magnetic elements.

9. The sputter deposition apparatus according to claim 8, wherein the magnet arrangement comprises at least two magnetic elements arranged such that a region of relatively high magnetic field strength, defined between the at least two magnetic elements, is in the form of a sheet.

10. The sputter deposition apparatus according to claim 8, wherein one or more of the magnetic elements is an electromagnet.

11. The sputter deposition apparatus according to claim 8, comprising a magnetic controller to control a magnetic field strength of one or more of the one or more magnetic elements.

12. The sputter deposition apparatus according to claim 8, wherein one or more of the magnetic elements comprises a solenoid, the solenoid being elongate in cross-section.

13. The sputter deposition apparatus according to claim 12, wherein the solenoid is elongate, in cross section, in a direction substantially parallel to an axis of rotation of the curved member.

14. The sputter deposition apparatus according to claim 8, wherein the magnet arrangement is disposed outside a curve of the curved member.

15. The sputter deposition apparatus according to claim 1, wherein the plasma source is an inductively coupled plasma source.

16. The sputter deposition apparatus according to claim 1, wherein the plasma source comprises one or more elongate antennae.

17. The sputter deposition apparatus according to claim 16, wherein one or more of the elongate antennae are substantially linear.

18. The sputter deposition apparatus according to claim 16, wherein one or more of the elongate antennae extend in a direction substantially perpendicular to the conveyance direction.

19. The sputter deposition apparatus according to claim 16, wherein one or more of the elongate antennae are curved.

20. The sputter deposition apparatus according to claim 19,
wherein one or more of the curved elongate antennae extend in a plane substantially perpendicular to the longitudinal axis of the curved member.

21. The sputter deposition apparatus according to claim 16, wherein one or more of the elongate antennae extend in a direction substantially parallel to a longitudinal axis of the curved member.

22. A sputter deposition method using the sputter deposition apparatus of claim 1, comprising:
- guiding the substrate, using the guiding member, in the conveyance direction;
- generating plasma using the plasma source;
- confining said plasma, using the magnet arrangement, to:
  - the pre-treatment zone, within which the substrate is exposed to the plasma; and
  - the sputter deposition zone, located after the pre-treatment zone in the conveyance direction, to provide for sputter deposition of the target material to the substrate;
- wherein the pre-treatment and sputter deposition zones are disposed about the guiding member.

* * * * *